(12) United States Patent
Nautiyal et al.

(10) Patent No.: US 10,755,774 B2
(45) Date of Patent: Aug. 25, 2020

(54) COUPLING COMPENSATION CIRCUITRY

(71) Applicant: Arm Limited, Cambridge (GB)

(72) Inventors: Vivek Nautiyal, Milpitas, CA (US);
Lalit Gupta, Cupertino, CA (US);
Fakhruddin Ali Bohra, San Jose, CA (US); Shri Sagar Dwivedi, San Jose, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/820,487

(22) Filed: Mar. 16, 2020

(65) Prior Publication Data

US 2020/0219559 A1 Jul. 9, 2020

Related U.S. Application Data

(63) Continuation of application No. 15/960,475, filed on Apr. 23, 2018, now Pat. No. 10,600,477.

(51) Int. Cl.
*G11C 11/00* (2006.01)
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC .................. G11C 11/419; G11C 11/412

USPC ....................................................... 365/156
See application file for complete search history.

(56) References Cited

U.S. PATENT DOCUMENTS

| 2012/0106236 A1* | 5/2012 | Singh | G11C 11/412 365/154 |
| 2015/0170721 A1* | 6/2015 | Dubey | G11C 7/12 365/189.16 |
| 2016/0093355 A1* | 3/2016 | Naeimi | G11C 11/161 365/158 |

* cited by examiner

*Primary Examiner* — Harry W Byrne
(74) *Attorney, Agent, or Firm* — Pramudji Law Group PLLC; Ari Pramudji

(57) ABSTRACT

Various implementations described herein refer to an integrated circuit having a bitcell coupled to a bitline and a column multiplexer device coupled to the bitline between the bitcell and an output of a write driver. The integrated circuit may include a first signal line coupled to a gate of the column multiplexor device that provides a first transition signal. The integrated circuit may include a second signal line coupled to an input of the write driver that provides a second transitioning signal, and the second transition signal transitions substantially similar to the first transitioning signal. The integrated circuit may include a coupling device coupled between the first signal line and the second signal line.

20 Claims, 5 Drawing Sheets

COUPLING COMPENSATION CIRCUITRY

CROSS-REFERENCE TO RELATED APPLICATIONS

This application is a continuation of patent application number U.S. Ser. No. 15/960,475, filed 2018 Apr. 23, the disclosure of which is herein incorporated by reference.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional circuit designs, during write operations, a write driver may pull down a bitline too low, so that a bitcell flips logic state. To save area and power, this write driver is typically shared across multiple bitlines, and these bitlines are multiplexed together. In some cases, pass transistors are used to connect multiple different bitlines to an output of the write driver. With technology scaling, memory operating voltage is not scaled, but this logic can operate at lower voltage. To save power, a memory array can be kept at a higher core voltage, but periphery voltage can be around 250 mv less than the memory array voltage. If the pass gate of a write multiplexor (mux) is kept at periphery voltage, then at low voltage, its drive can be reduced significantly, and the write operation can become difficult to achieve. For this reason, the pass transistors can be driven by the core supply voltage, and the driver for write column select signals (yw) can be placed in a center spine (or bus) and drive all of the bitcells. For wide memory, these signals may not be limited by resistance for a long line, and due to parasitic capacitance, these signals see a low-going coupling and can act as a poor switch to discharge bitlines. As size of a data word of memory can be very wide, parasitic capacitive coupling becomes significant and highly detrimental to memory operation and function.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to memory circuitry with coupling compensation. For instance, various implementations described herein refer to Bitline-to-YW miller coupling compensation for improved write margin, wherein YW refers to write column multiplexor select signal line. In other instances, various implementations described herein refer to Bitline-to-NYR miller coupling compensation for improved read margin, wherein NYR refers to read column multiplexor select signal line. Further, various implementations described herein provide for various schemes and techniques to improve read and write margins of memory, such as, e.g., static random access memory (SRAM). Implementing various schemes and techniques described herein may provide for improved read and write margins for memory (e.g., SRAM) and increased read and write assist efficiency including reduced area of assist capacitors.

Various implementations of bitline write assist circuitry will be described in detail herein with reference to FIGS. 1-5.

Figure 1:
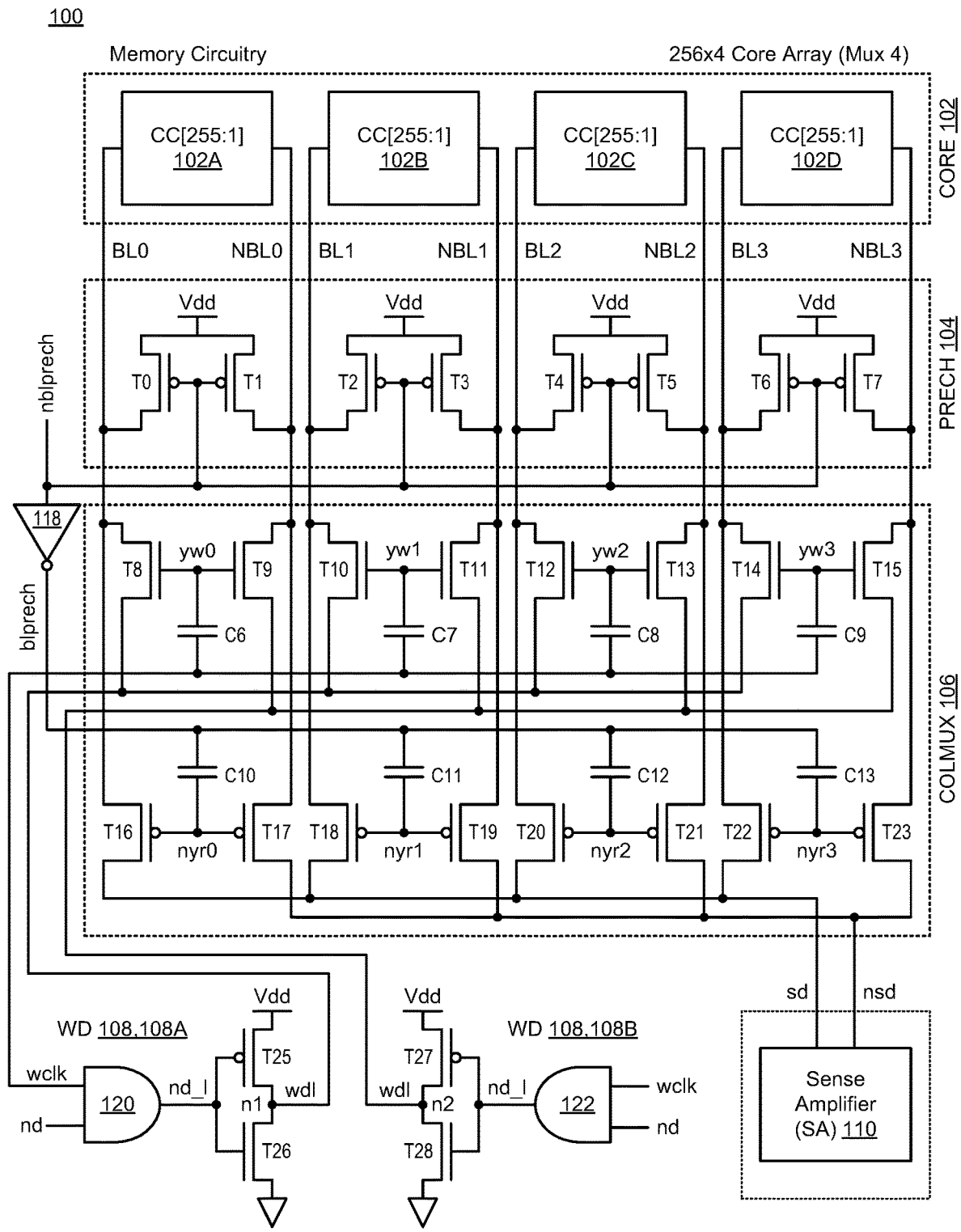
FIG. 1 illustrates a diagram of memory circuitry with coupling compensation in accordance with various implementations described herein.

FIG. 1 illustrates a schematic diagram of memory circuitry 100 with coupling compensation in accordance with various implementations described herein.

As shown in FIG. 1, the memory circuitry 100 includes various components including, e.g., core array circuitry 102 (CORE), precharge circuitry 104 (PRECH), column multiplexer circuitry 106 (COLMUX), write driver circuitry 108 (WD), and sense amplifier circuitry 110 (SA). Further description related to the memory circuitry 100 and the various components associated therewith are described in greater detail herein below.

The memory circuitry 100 may be implemented as an integrated circuit (IC) in using various types of memory, such as, e.g., random access memory (RAM), including static RAM (SRAM), and/or any other types of volatile memory. In some instances, the memory circuitry 100 may be implemented as an IC with dual rail memory architecture and related circuitry. In other instances, the memory circuitry 100 may be integrated with computing circuitry and related components on a single chip. Also, the memory circuitry 100 may be implemented in an embedded system for various electronic and mobile applications, including low power sensor nodes.

Referring to diagram of FIG. 1, the memory circuitry 100 may include the core circuitry 102 (CORE) having an array of memory cells (or bitcells) that are arranged in columns and rows. In some implementations, the CORE 102 may be embodied as a MUX 4: 256×4 core array with one or more banks 102A, 102B, 102C, 102D of memory cells (or bitcells) having 256 rows of bitcells (CC[255:1]). Also, the CORE 102 may include a row decoder (ROWDEC) and a column decoder (COLDEC) for accessing each of memory cells via a selected wordline (WL) and one or more selected bitlines (BL, such as, e.g., BL0, BL1, BL2, BL3, and NBL, such as, e.g., NBL0, NBL1, NBL2, NBL3). Thus, the CORE 102 may include one or more arrays of bitcells (e.g., banks 102A, 102B, 102C, 102D) that are accessible via at least one wordline (WL) and one or more bitlines (e.g., BL0, BL1, BL2, BL3 and NBL0, NBL1, NBL2, NBL3). In some instances, the CORE 102 and various components thereof may operate at a source voltage supply, such as, e.g., a core supply voltage Vdd along with ground or negative (−) voltage supply Vss. In other instances, the voltage range may vary with technology.

As described herein above, the core array circuitry 102 (CORE) may include multiple banks of memory cell arrays, wherein each memory cell may be referred to as a bitcell. Further, each memory cell may be configured to store at least one data bit value (e.g., a data value related to a logical '0' or '1'). In various instances, the array of memory cells may include any number of memory cells (or bitcells) that are arranged in various applicable configurations, such as, e.g., a two-dimensional (2D) memory array having any number of columns (Ncolumns) and any number of rows (Nrows) of multiple memory cells arranged in a 2D grid pattern with 2D indexing capabilities.

In some cases, each memory cell (or bitcell) may be implemented with random access memory (RAM) circuitry, or some other type of volatile type memory. For instance, each memory cell (or bitcell) may include various multi-transistor static RAM (SRAM) cells, including various types of SRAM cells, such as, e.g., 6T CMOS SRAM and/or various other types of complementary MOS (CMOS) SRAM cells, such as, e.g., 2T, 4T, 8T, 10T, 12T, 14T or more transistors per bit. Further, in some cases, the memory circuitry 100 may operate at one or more source voltage levels (Vdd, Vss, etc.) with a voltage range that varies with the applicable technology for specific integrated circuits (ICs).

The memory circuitry 100 may include the precharge circuitry 104 (PRECH) having one or more precharge transistors (e.g., PMOS transistors T0, T1, T2, T3, T4, T5, T6, T7) that are arranged in parallel and coupled to corresponding bitlines (BL0, BL1, BL2, BL3 and NBL0, NBL1, NBL2, NBL3). In some instances, each of the precharge transistors (T0, T1, T2, T3, T4, T5, T6, T7) may be activated based on a precharge control signal (nblprech). In some instances, the precharge control signal (nblprech) may be inverted with an inverter 118 to provide a bitline precharge signal (blprech), which is provided (or supplied) to the COLMUX 106. Further, as shown, each of the precharge transistors (T0, T1, T2, T3, T4, T5, T6, T7) may be coupled between the source voltage supply Vdd and a corresponding bitline (BL0, BL1, BL2, BL3 and NBL0, NBL1, NBL2, NBL3).

The memory circuitry 100 may also include the column multiplexer (mux) circuitry 106 (COLMUX) having one or more first column multiplexor devices (e.g., NMOS transistors T8, T9, T10, T11, T12, T13, T14, T15) designated for write operations that are arranged in parallel to operate as a write multiplexer and are coupled to corresponding bitlines (BL0, BL1, BL2, BL3 and NBL0, NBL1, NBL2, NBL3). Also, the column multiplexer circuitry 106 (COLMUX) may include one or more second column multiplexor devices (e.g., PMOS transistors T16, T17, T18, T19, T20, T21, T22, T23) designated for read operations that are arranged in parallel to operate as a read multiplexer and are coupled to corresponding bitlines (BL0, BL1, BL2, BL3 and NBL0, NBL1, NBL2, NBL3). In some implementations, the column mux circuitry 106 (COLMUX) may be referred to as read and write circuitry (or a read/write column multiplexor) having a write component part with one or more write devices (e.g., the first column mux devices T8, T9, T10, T11, T12, T13, T14, T15) and a read component part with one or more read devices (e.g., the second column mux devices T16, T17, T18, T19, T20, T21, T22, T23). In some instances, the read and write circuitry may include write driver WD 108, 108A, 108B and sense amplifier SA 110.

In some implementations, each of the first column multiplexor devices (T8, T9, T10, T11, T12, T13, T14, T15) may be activated based on a write column multiplexor select signal (yw, such as, e.g., yw0, yw1, yw2, yw3). Also, as shown in FIG. 1, each of the first column multiplexor devices (T8, T9, T10, T11, T12, T13, T14, T15) may be coupled between a corresponding bitline (BL0, BL1, BL2, BL3 and NBL0, NBL1, NBL2, NBL3) and a write data line (wdl), which is coupled to an output of write driver 108.

In some implementations, each of the second column multiplexor devices (T16, T17, T18, T19, T20, T21, T22, T23) may be activated based on a read column multiplexor select signal (nyr, such as, e.g., nyr0, nyr1, nyr2, nyr3). Also, as shown in FIG. 1, each of the second column multiplexor devices (T16, T17, T18, T19, T20, T21, T22, T23) may be coupled between a corresponding bitline (BL0, BL1, BL2, BL3 and NBL0, NBL1, NBL2, NBL3) and a sensed data line (sd) or an inverted sensed data line (nsd), which is coupled to an output of sense amplifier (SA) 110.

The memory circuitry 100 may include the write driver circuitry 108 (WD) having a first write driver 108A and a second write driver 108B, e.g., as part of the column mux circuitry 106 (COLMUX). As shown in FIG. 1, the first write driver 108A includes a NAND gate 120 and an inverter having a PMOS transistor T25 and an NMOS transistor T26 that are coupled between source voltage levels (Vdd and Vss). The first write driver 108A includes an output at node n1 that is coupled to column mux devices T8, T10, T12, T14. Also, the NAND gate 120 receives a write clock signal (wclk) and data signal (nd) as inputs and provides an output signal (nd_I) to gates of the transistors T25, T26. As also shown, the invertor arrangement of transistors T25, T26 provide a write data line (wdl) signal as the output from the first write driver 108A at node n1 to the column mux devices T8, T10, T12, T14. Thus, the column mux devices T8, T10, T12, T14 are coupled to corresponding bitlines (BL0, BL1, BL2, BL3) between the bitcells in memory banks 102A, 102B, 102C, 102D and the first write driver 108A.

Further, as shown in FIG. 1, the second write driver 108B includes a NAND gate 122 and an inverter having a PMOS transistor T27 and an NMOS transistor T28 that are coupled between source voltage levels (Vdd and Vss). The second write driver 108B includes an output at node n2 that is coupled to column mux devices T9, T11, T13, T15. Also, the NAND gate 122 receives the write clock signal (wclk) and the data signal (nd) as inputs and provides an output signal (nd_I) to gates of the transistors T27, T28. As also shown, the invertor arrangement of transistors T27, T28 provide a write data line (wdl) signal as the output from the second write driver 108B at node n2 to the column mux devices T9, T11, T13, T15. Thus, the column mux devices T9, T11, T13, T15 are coupled to corresponding bitlines (NBL0, NBL1, NBL2, NBL3) between the bitcells in memory banks 102A, 102B, 102C, 102D and the second write driver 108B.

In some implementations, the memory circuitry 100 may include one or more coupling devices (C6, C7, C8, C9) that are coupled between a first signal line, such as, e.g., the write column multiplexor select signal line yw (yw0, yw1, yw2, yw3), and a second signal line, such as, e.g., write clock signal line (wclk). In some instances, the coupling devices (C6, C7, C8, C9) may be coupled between the gates of the corresponding column mux devices (T8, T9, T10, T11, T12, T13, T14, T15) and the second signal line, such as, e.g., write clock signal line (wclk). In some cases, the coupling devices (C6, C7, C8, C9) may be implemented with a capacitor. In other cases, the coupling devices (C6, C7, C8, C9) may be implemented with transistors that are coupled together to operate (and/or function) as a capacitor. Hence, as shown in FIG. 1, the coupling devices (C6, C7, C8, C9) are coupled between corresponding write column mux select signals (yw0, yw1, yw2, yw3) and the write clock signal (wclk). In various implementations, the coupling devices (C6, C7, C8, C9) may be coupled between the YW signal lines (yw0, yw1, yw2, yw3) and any other signal line that transitions the same as the YW signal.

The memory circuitry 100 may include the sense amplifier circuitry 110 (SA), e.g., as part of the column mux circuitry 106 (COLMUX). As shown in FIG. 1, the sense amplifier circuitry 110 (SA) provides multiple output signals, such as, e.g., the sensed data signal (sa) as s first output signal and a complementary sensed data signal (nsd) as a second output signal. As shown, the first output signal line (sd) from the sense amplifier circuitry 110 (SA) is coupled to the column mux devices T16, T18, T20, T22, and the second output signal line (nsd) from the sense amplifier circuitry 110 (SA) is coupled to the column mux devices T17, T19, T21, T23. As such, the column mux devices T16, T18, T20, T22 are coupled to corresponding bitlines (BL0, BL1, BL2, BL3) between the bitcells in memory banks 102A, 102B, 102C, 102D and the sense amplifier circuitry 110 (SA), and the column mux devices T17, T19, T21, T23 are coupled to corresponding bitlines (NBL0, NBL1, NBL2, NBL3) between the bitcells in memory banks 102A, 102B, 102C, 102D and the sense amplifier circuitry 110 (SA).

In some implementations, the memory circuitry 100 may include one or more coupling devices (C10, C11, C12, C13) that are coupled between a third signal line, such as, e.g., the read column multiplexor select signal line nyr (nyr0, nyr1, nyr2, nyr3), and a fourth signal line, such as, e.g., bitline precharge signal line (blprech). In some instances, the coupling devices (C10, C11, C12, C13) may be coupled between the gates of the corresponding column mux devices (T16, T17, T18, T19, T20, T21, T22, T23) and the fourth signal line, such as, e.g., bitline precharge signal line (blprech). In some cases, the coupling devices (C10, C11, C12, C13) may be implemented with a capacitor. In other cases, the coupling devices (C10, C11, C12, C13) may be implemented with one or more transistors that are coupled together to operate (and/or function) as a capacitor. Hence, as shown in FIG. 1, the coupling devices (C10, C11, C12, C13) are coupled between corresponding read column mux select signals (nyr0, nyr1, nyr2, nyr3) and the invert (or inversion) of the bitline precharge signal (blprech). In various instances, the coupling devices (C10, C11, C12, C13) may be coupled between the NYR signal lines (nyr0, nyr1, nyr2, nyr3) and any other signal line that transitions the same as the NYR signal.

Figure 2:
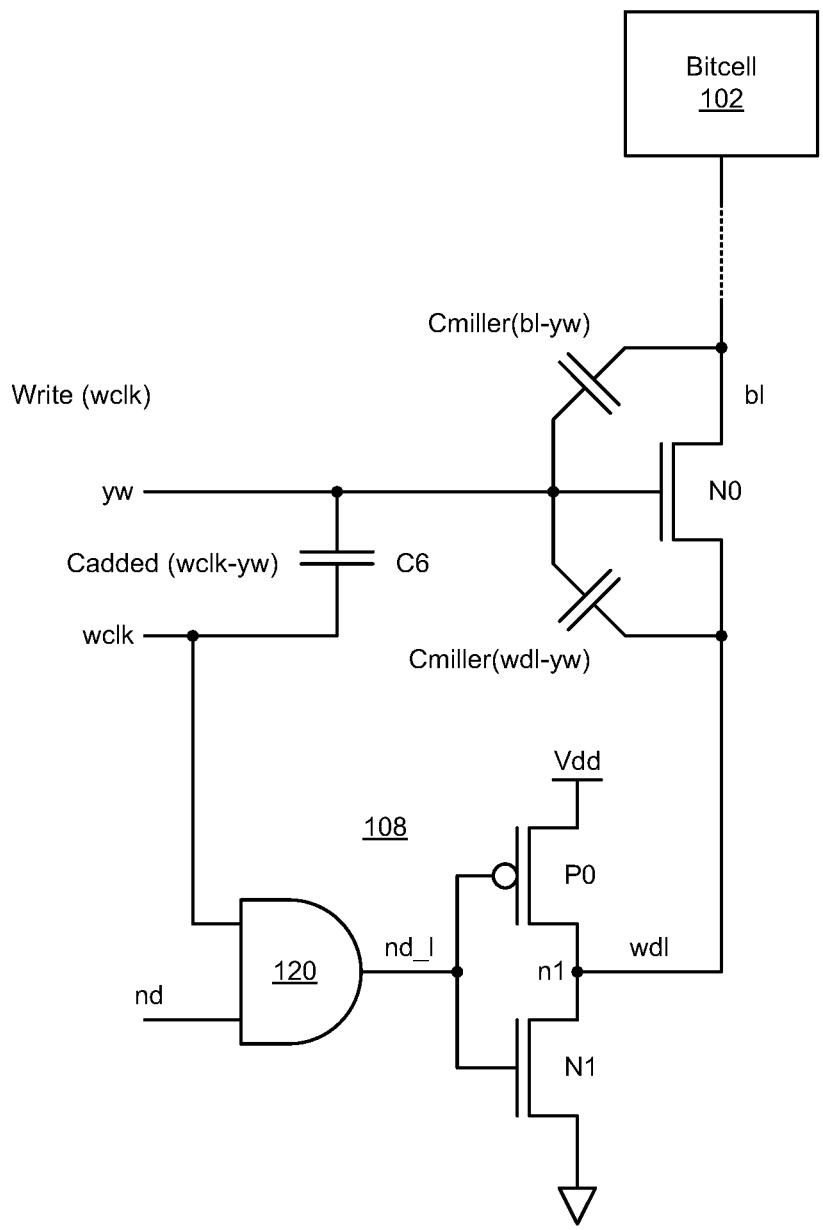
FIGS. 2 and 3 illustrate various circuit diagrams of column multiplexor devices in accordance with various implementations described herein.
Figure 3:
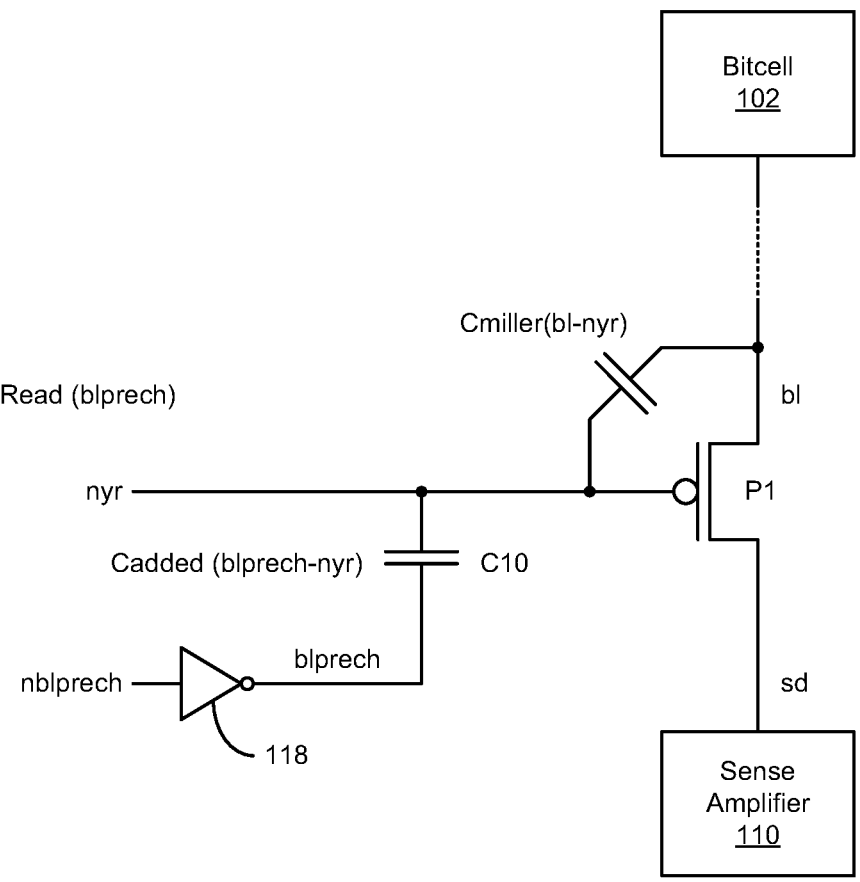

FIGS. 2 and 3 illustrate various diagrams of column multiplexor (mux) devices in accordance with implementations described herein. In particular, FIG. 2 illustrates a diagram 200 of a first column mux device (N0) with parasitic capacitance, and FIG. 3 illustrates a diagram 300 of a second column mux device (P1) with parasitic capacitance. In reference to FIGS. 2 and 3, various components described therein are similar in scope and functionality to related components as shown and described in FIG. 1.

As shown in FIG. 2, the bitcell 102 is coupled to the bitline (bl), and the column mux device (N0) is coupled to the bitline (bl) between the bitcell 102 and the output of the write driver 108 at node n1. In some instances, the column mux device (N0) may include a transistor, and the first signal line (yw) may be coupled to the gate of the transistor. The write driver 108 may include an inverter (e.g., the arrangement of transistors P0, N1), and the column mux device (N0) may be coupled to the bitline (bl) between the bitcell 102 and the output of the inverter (P0, N1). Further, as shown, a write driver line (wdl) is coupled between the output of the write driver 108 and the column mux device (N0). Also, in some instances, the write driver 108 may include the AND gate 120.

The first signal line (yw) is coupled to the gate of the column mux device (N0), and the first signal line (yw) provides the first transition signal. In some instances, the first signal line (yw) is implemented with the write column multiplexer select signal line, which is coupled to the gate of the column mux device (NO).

The second signal line (wclk) is coupled to the input of the write driver 108, and the second signal line (wclk) provides a second transitioning signal. The second transition signal transitions substantially similar to the first transitioning signal. In some instances, the second signal line (wclk) may be implemented with a write clock signal line, which is coupled to the input of the write driver 108. Also, as shown, the second signal line (wclk) is coupled to the input of the write driver 108, e.g., at the input of the AND gate 120, and the inverted data signal (nd) is also coupled to another input of the AND gate 120. Further, the AND gate 120 provides an output signal (nd_I) to the gates of the transistors (P0, N1) based on the input signals (wclk, nd). Hence, the inverter arrangement of the transistors (P0, N1) provide the output of the write driver 108 at node n1.

The coupling device (C6) may be coupled between the first signal line (yw) and the second signal line (wclk). As shown, the coupling device (C6) is coupled between the gate of the column mux device (NO) and the second signal line (wclk). In some instances, the coupling device (C6) may be implemented with a capacitor. In other instances, the coupling device (C6) may be implemented with one or more transistors that are coupled together to operate (and/or function) as a capacitor.

In some implementations, as shown in FIG. 2, the column mux write driver NMOS stack (i.e., N0, N1) may generate (and/or develop) various MOS based parasitic miller capacitance, such as, e.g., Cmiller(bl-yw) and Cmiller(wdl-yw). In some instances, as shown, a first parasitic miller capacitance Cmiller(bl-yw) may generate (and/or develop) between the bitline (bl) and the first signal line (yw). In various other instances, as shown, a second parasitic miller capacitance Cmiller(wdl-yw) may generate (and/or develop) between the bitline (bl) and the write driver line (wdl), e.g., at the output of the write driver 108. Further, as shown, the coupling device (C6) may provide an added (or additional) capacitance, such as, e.g., Cadded(wclk-yw).

As shown in FIG. 3, the bitcell 102 is coupled to the bitline (bl), and the column mux device (P1) is coupled to the bitline (bl) between the bitcell 102 and the output of the sense amplifier 110. In some instances, the column mux device (P1) includes a transistor, and the third signal line (nyr) may be coupled to the gate of the transistor.

The third signal line (nyr) is coupled to the gate of the column mux device (P1), and the third signal line (nyr) provides the third transition signal. In some instances, the third signal line (nyr) is implemented with a read column multiplexer select signal line, which is coupled to the gate of the column mux device (P1).

The fourth signal line (blprech) is coupled to the output of the logic device 118, and the fourth signal line (blprech) provides the fourth transitioning signal. The fourth transition signal transitions substantially similar to the third transitioning signal. In some instances, the second signal line (blprech) is implemented with a bitline precharge signal line that is coupled to the output of the logic device 118. In some cases, the logic device 118 may implemented with an inverter.

The coupling device (C10) is coupled between the third signal line (nyr) and the fourth signal line (blprech). As shown, the coupling device (C10) may be coupled between the gate of the column mux device (P1) and the fourth signal line (blprech). In some instances, the coupling device (C10)

may be implemented with a capacitor. In some other instances, the coupling device (C10) may be implemented with one or more transistors that are coupled together to operate (and/or function) as a capacitor.

In some implementations, as shown in FIG. 3, the read column mux device (P1) is used to couple (or connect) the bitline (bl) to the output (sd) of the sense amplifier 110 with parasitic miller capacitance, such as, e.g., Cmiller(bl-nyr). In various instances, as shown, a parasitic miller capacitance Cmiller(bl-nyr) may generate (and/or develop) between the bitline (bl) and the third signal line (nyr). Further, the coupling device (C10) may provide an added (or additional) capacitance, such as, e.g., Cadded(blprech-yw).

Figure 4:
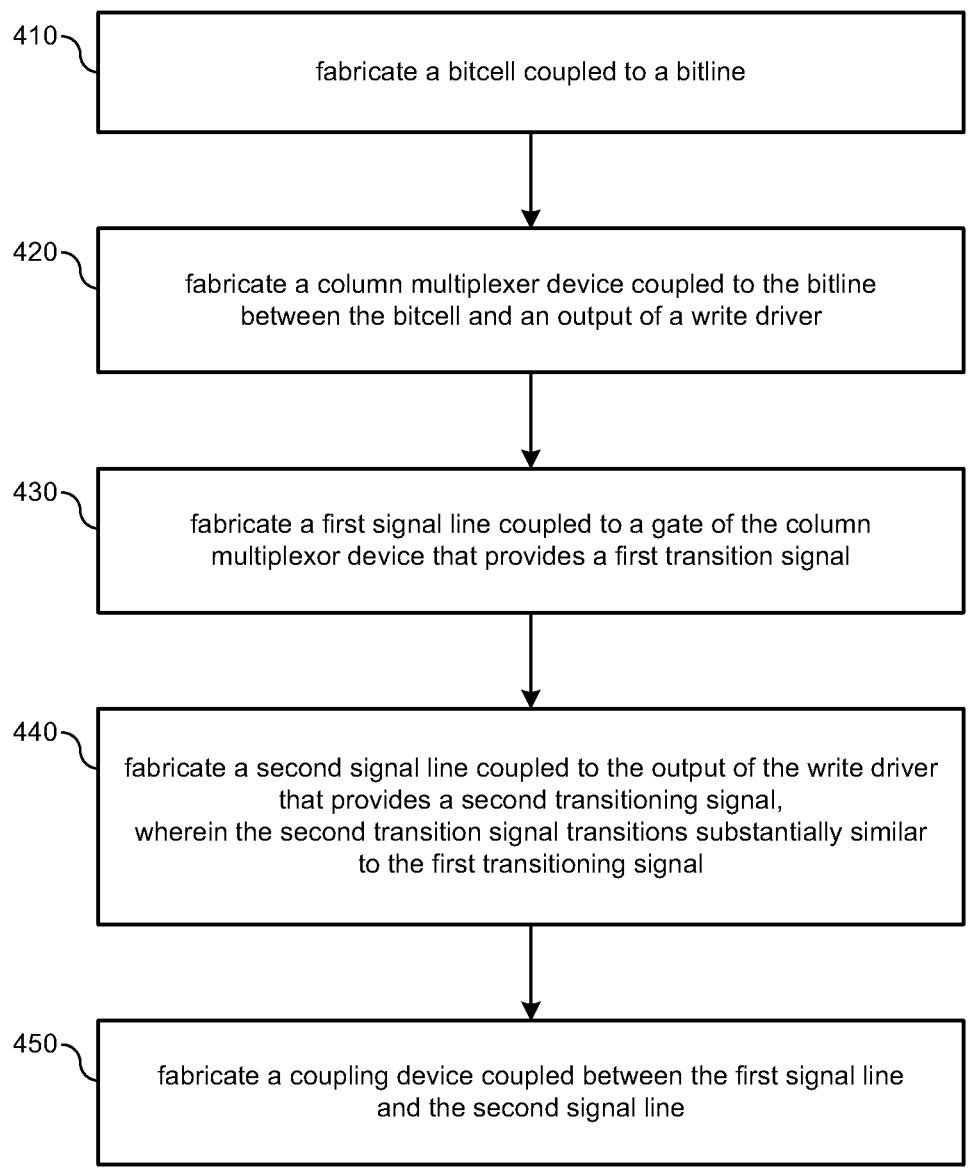
FIGS. 4 and 5 illustrate various process diagrams of methods for fabricating an integrated circuit in accordance with various implementations described herein.

FIG. 4 illustrates a process flow diagram of a method 400 for fabricating an integrated circuit in accordance with various implementations described herein.

It should be understood that even though method 400 may indicate a particular order of operation execution, in some cases, various specific portions of operations may be executed in a different order, and on different systems. Some additional operations and/or steps may be added to and/or omitted from method 400. Also, method 400 may be implemented in hardware and/or software. If implemented in hardware, method 400 may be implemented with various circuit elements, such as described herein above in reference to FIGS. 1-3. If implemented in software, method 400 may be implemented as a program or software instruction process that may be configured for providing memory circuitry with coupling compensation as described herein above. Further, if implemented in software, instructions related to implementing the method 400 may be stored in memory and/or a database. For instance, a computer or various other types of computing devices having a processor and memory may be configured to perform method 400.

As described and shown in reference to FIG. 4, method 400 may be utilized for manufacturing, fabricating, and/or producing an integrated circuit (IC) that implements memory circuitry having coupling compensation.

At block 410, method 400 may fabricate a bitcell coupled to a bitline. In various implementations, the bitcell may be one of multiple bitcells in an array of bitcells that may include various types of memory storage cells, such as, e.g., SRAM.

At block 420, method 400 may fabricate a column multiplexer device coupled to the bitline between the bitcell and an output of a write driver. The column multiplexer device may be implemented with a transistor, and in this instance, the first signal line may be coupled to the gate of the transistor. The write driver may be implemented with an inverter, and in this instance, the column multiplexer device may be coupled to the bitline between the bitcell and the output of the inverter.

At block 430, method 400 may fabricate a first signal line coupled to a gate of the column multiplexor device that provides a first transition signal. The first signal line may include a write column multiplexer select signal line that is coupled to the gate of the column multiplexor device.

At block 440, method 400 may fabricate a second signal line coupled to the input of the write driver that provides a second transitioning signal, wherein the second transition signal transitions substantially similar to the first transitioning signal. The second signal line may include a write clock (WCLK) signal line that is coupled to the input of the write driver.

At block 450, method 400 may fabricate a coupling device coupled between the first signal line and the second signal line. The coupling device may be coupled between a gate of the column multiplexor device and the second signal line. The coupling device may be implemented with a capacitor. The coupling device may be implemented with a transistor that is coupled together to operate as a capacitor. For instance, the coupling device may be implemented with a transistor that is arranged (or coupled together) in a manner to operate (or function) as a capacitor.

Figure 5:
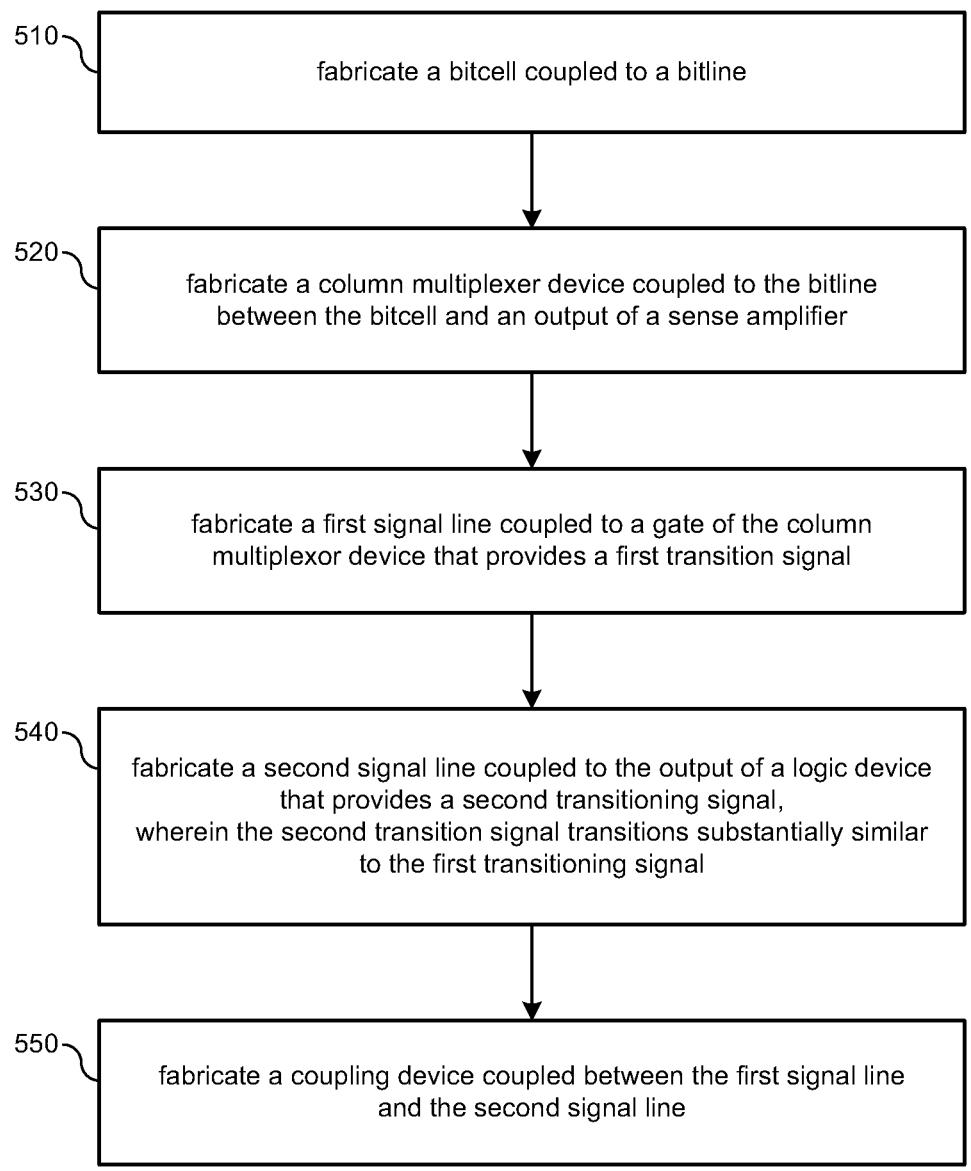

FIG. 5 illustrates a process flow diagram of a method 500 for fabricating an integrated circuit in accordance with various implementations described herein.

It should be understood that even though method 500 may indicate a particular order of operation execution, in some cases, various specific portions of operations may be executed in a different order, and on different systems. Some additional operations and/or steps may be added to and/or omitted from method 500. Also, method 500 may be implemented in hardware and/or software. If implemented in hardware, method 500 may be implemented with various circuit elements, such as described herein above in reference to FIGS. 1-3. If implemented in software, method 500 may be implemented as a program or software instruction process that may be configured for providing memory circuitry with coupling compensation as described herein above. Further, if implemented in software, instructions related to implementing the method 500 may be stored in memory and/or a database. For instance, a computer or various other types of computing devices having a processor and memory may be configured to perform method 500.

As described and shown in reference to FIG. 5, method 500 may be utilized for manufacturing, fabricating, and/or producing an integrated circuit (IC) that implements memory circuitry having coupling compensation.

At block 510, method 500 may fabricate a bitcell coupled to a bitline. In various implementations, the bitcell may be one of multiple bitcells in an array of bitcells that may include various types of memory storage cells, such as, e.g., SRAM.

At block 520, method 500 may fabricate a column multiplexer device coupled to the bitline between the bitcell and an output of a sense amplifier. The column multiplexer device may be implemented with a transistor, and the first signal line may be coupled to the gate of the transistor.

At block 530, method 500 may fabricate a first signal line coupled to a gate of the column multiplexor device that provides a first transition signal. The first signal line may include a read column multiplexer select signal line that is coupled to the gate of the column multiplexor device.

At block 540, method 500 may fabricate a second signal line coupled to the output of a logic device that provides a second transitioning signal, wherein the second transition signal transitions substantially similar to the first transitioning signal. The second signal line may include a bitline precharge signal line that is coupled to the output of the logic device. The logic device may be implemented with an inverter.

At block 550, method 500 may fabricate a coupling device coupled between the first signal line and the second signal line. The coupling device may be coupled between a gate of the column multiplexor device and the second signal line. The coupling device may be implemented with a capacitor. The coupling device may be implemented with a transistor that is coupled together to operate as a capacitor. For instance, the coupling device may be implemented with a transistor that is arranged (or coupled together) in a manner to operate (or function) as a capacitor.

Described herein are various implementations of an integrated circuit. The integrated circuit may include a bitcell coupled to a bitline. The integrated circuit may include a column multiplexer device coupled to the bitline between the bitcell and an output of a write driver. The integrated circuit may include a first signal line coupled to a gate of the column multiplexor device that provides a first transition signal. The integrated circuit may include a second signal line coupled to an input of the write driver that provides a second transitioning signal, wherein the second transition signal transitions substantially similar to the first transitioning signal. The integrated circuit may include a coupling device coupled between the first signal line and the second signal line.

Described herein are various implementations of an integrated circuit. The integrated circuit may include a bitcell coupled to a bitline. The integrated circuit may include a column multiplexer device coupled to the bitline between the bitcell and an output of a sense amplifier. The integrated circuit may include a first signal line coupled to a gate of the column multiplexor device that provides a first transition signal. The integrated circuit may include a second signal line coupled to an output of a logic device that provides a second transitioning signal. The second transition signal transitions substantially similar to the first transitioning signal. The integrated circuit may include a coupling device coupled between the first signal line and the second signal line.

Described herein are various implementations of an integrated circuit. The integrated circuit may include a bitcell coupled to a bitline. The integrated circuit may include read and write circuitry having a first column multiplexer device and a second column multiplexer device. The first column multiplexer device may be coupled to the bitline between the bitcell and a write driver, and the second column multiplexer device may be coupled to the bitline between the bitcell and a sense amplifier. The integrated circuit may include multiple signal lines including a first signal line, a second signal line, a third signal line, and a fourth signal line. The first signal line may be coupled to a gate of the first column multiplexor device and may provide a first transition signal. The second signal line may be coupled to the write driver and may provide a second transitioning signal that transitions substantially similar to the first transitioning signal. The third signal line may be coupled to a gate of the second column multiplexor device and may provide a third transition signal. The fourth signal line may be coupled to a logic device and may provide a fourth transitioning signal that transitions substantially similar to the third transitioning signal. The integrated circuit may include multiple coupling devices including a first coupling device and a second coupling device. The first coupling device may be coupled between the first signal line and the second signal line, and the second coupling device may be coupled between the third signal line and the fourth signal line.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. An integrated circuit, comprising:
a bitcell coupled to a bitline;

a column multiplexer device coupled to the bitline between the bitcell and an output of a sense amplifier;

a first signal line coupled to a gate of the column multiplexer device that provides a first transition signal;

a second signal line coupled to an output of a logic device that provides a second transition signal, wherein the second transition signal transitions substantially similar to the first transition signal; and a coupling device coupled between the first signal line and the second signal line.

2. The integrated circuit of claim 1, wherein the column multiplexer device comprises a transistor.

3. The integrated circuit of claim 1, wherein the first signal line comprises a read column multiplexer select signal line that is coupled to the gate of the column multiplexer device.

4. The integrated circuit of claim 1, wherein the second signal line comprises a bitline precharge signal line that is coupled to the output of the logic device.

5. The integrated circuit of claim 1, wherein the logic device comprises an inverter.

6. The integrated circuit of claim 1, wherein the coupling device is coupled between the gate of the column multiplexer device and the second signal line.

7. The integrated circuit of claim 1, wherein the coupling device comprises a capacitor.

8. The integrated circuit of claim 1, wherein the coupling device comprises a transistor that is coupled together to operate as a capacitor.

9. An integrated circuit, comprising:

a bitcell coupled to a bitline;

read and write circuitry having a first column multiplexer device and a second column multiplexer device, wherein the first column multiplexer device is coupled to the bitline between the bitcell and a write driver, and wherein the second column multiplexer device is coupled to the bitline between the bitcell and a sense amplifier;

multiple signal lines including a first signal line, a second signal line, a third signal line, and a fourth signal line, wherein the first signal line is coupled to a gate of the first column multiplexer device and provides a first transition signal, wherein the second signal line is coupled to the write driver and provides a second transition signal that transitions substantially similar to the first transition signal, wherein the third signal line is coupled to a gate of the second column multiplexer device and provides a third transition signal, and wherein the fourth signal line is coupled to a logic device and provides a fourth transition signal that transitions substantially similar to the third transition signal; and multiple coupling devices including a first coupling device and a second coupling device, wherein the first coupling device is coupled between the first signal line and the second signal line, and wherein the second coupling device is coupled between the third signal line and the fourth signal line.

10. The integrated circuit of claim 9, wherein the first coupling device is coupled between the gate of the first column multiplexer device and the second signal line, and wherein the second coupling device is coupled between the gate of the second column multiplexer device and the fourth signal line.

11. The integrated circuit of claim 9, wherein the first coupling device comprises a first capacitor, and wherein the second coupling device comprises a second capacitor.

12. The integrated circuit of claim 9, wherein the first coupling device comprises a first transistor that is coupled together to operate as a first capacitor, and wherein the second coupling device comprises a second transistor that is coupled together to operate as a second capacitor.

13. The integrated circuit of claim 9, wherein the first column multiplexer device comprises a first transistor, and wherein the second column multiplexer device comprises a second transistor.

14. The integrated circuit of claim 9, wherein the write driver comprises an inverter, and wherein the first column multiplexer device is coupled to the bitline between the bitcell and an output of the inverter.

15. The integrated circuit of claim 9, wherein the logic device comprises an inverter, and wherein the fourth signal line is coupled to an output of the inverter.

16. The integrated circuit of claim 9, wherein the first signal line comprises a write column multiplexer select signal line that is coupled to the gate of the first column multiplexer device.

17. The integrated circuit of claim 9, wherein the third signal line comprises a read column multiplexer select signal line that is coupled to the gate of the second column multiplexer device.

18. The integrated circuit of claim 9, wherein the second signal line comprises a write clock signal line that is coupled to an input of the write driver.

19. The integrated circuit of claim 9, wherein the fourth signal line comprises a bitline precharge signal line that is coupled to an output of the logic device.

20. A method of manufacturing an integrated circuit, comprising:

fabricating a bitcell coupled to a bitline;

fabricating a column multiplexer device coupled to the bitline between the bitcell and an output of a sense amplifier;

fabricating a first signal line coupled to a gate of the column multiplexer device that provides a first transition signal;

fabricating a second signal line coupled to an output of a logic device that provides a second transition signal, wherein the second transition signal transitions substantially similar to the first transition signal; and fabricating a coupling device coupled between the first signal line and the second signal line.

* * * * *